United States Patent [19]

Scheuermann

[11] Patent Number: 4,716,537
[45] Date of Patent: Dec. 29, 1987

[54] CIRCUIT ARRANGEMENT FOR SIMULATING A RESISTIVE ELEMENTARY TWO PORT DEVICE FOR USE IN A WAVE DIGITAL FILTER

[75] Inventor: Helmut Scheuermann, Backnang, Fed. Rep. of Germany

[73] Assignee: ANT Nachrichtentechnik GmbH, Backnang, Fed. Rep. of Germany

[21] Appl. No.: 592,799

[22] Filed: Mar. 23, 1984

[30] Foreign Application Priority Data

Mar. 25, 1983 [EP] European Pat. Off. ......... EP 83 102 9681

[51] Int. Cl.⁴ .............................................. G06F 7/38
[52] U.S. Cl. .................................................. 364/724
[58] Field of Search ................ 364/724; 333/168, 202, 333/203

[56] References Cited

U.S. PATENT DOCUMENTS

| | | | |
|---|---|---|---|
| 3,967,099 | 6/1976 | Fettweis | 364/724 |
| 4,061,905 | 12/1977 | Fettweis | 364/724 |
| 4,095,276 | 6/1978 | Verkroost et al. | 364/724 |
| 4,192,008 | 3/1980 | Mandeville | 364/724 |
| 4,344,148 | 8/1982 | Brantingham et al. | 364/724 |
| 4,475,229 | 10/1984 | Frese | 381/63 |

FOREIGN PATENT DOCUMENTS 2027303 12/1971 Fed. Rep. of Germany ...... 364/724
2418923 10/1975 Fed. Rep. of Germany ...... 364/724

OTHER PUBLICATIONS

"Wave Digital Filter Hardware Structure", Stuart Lawson, *IEE Proc.*, vol. 128, Pt. 6, #6, pp. 307-312, Dec. 1981.

"Class of Wave Digital Filters Consisting Only of Adders and Multipliers", Nouia, *Electronics Letters*, vol. 12, #19, pp. 500-501, 9/16/76.

Alfred Fettweis et al, IEEE, "On Adaptor for Wave Digital Filters", vol. ASSP-23, No. 6, Dec. 1975, pp. 516-525.

A. Fettweis, "Digital Filter Structures", AEÜ Band 25, (1971), Heft 2, pp. 79-89.

*Primary Examiner*—Gary V. Harkcom
*Assistant Examiner*—Dale M. Shaw
*Attorney, Agent, or Firm*—Spencer & Frank

[57] ABSTRACT

A wave two port circuit arrangement for simulating a resistive elementary port two device for use in a wave digital filter. First and second ports are each arranged for receiving input and output signals. A summing device is connected to the first and second ports and produces a sum signal which represents the sum of the input signals present at the first and second ports. A multiplier is connected to the summing device and to one of the first and second ports for producing a negatively scaled sum signal and feeding it to the one port as part of the output signal present at that port.

11 Claims, 26 Drawing Figures

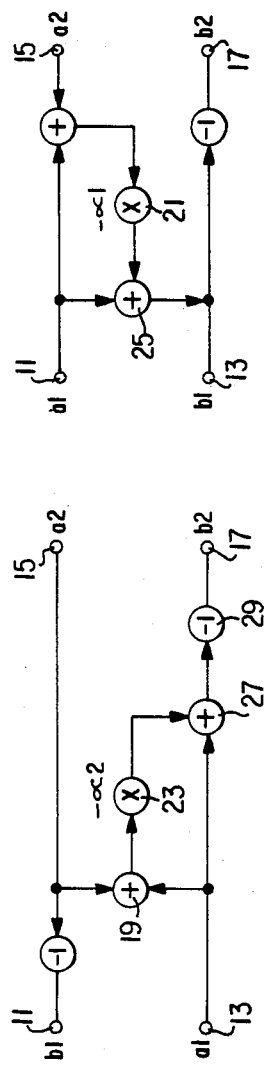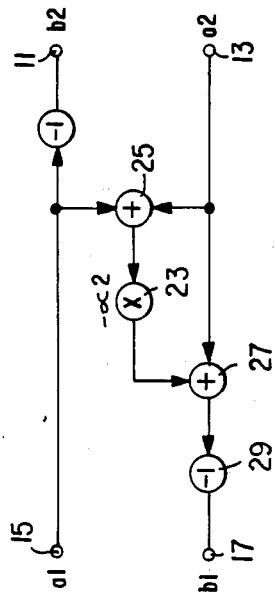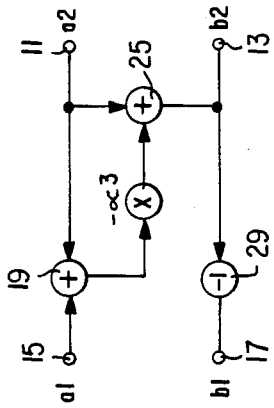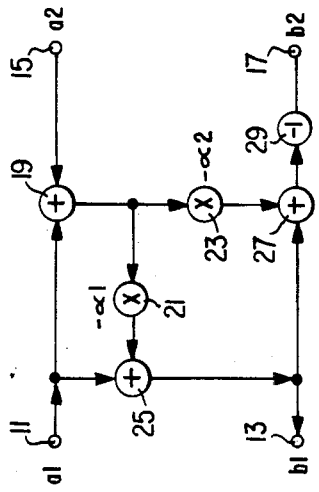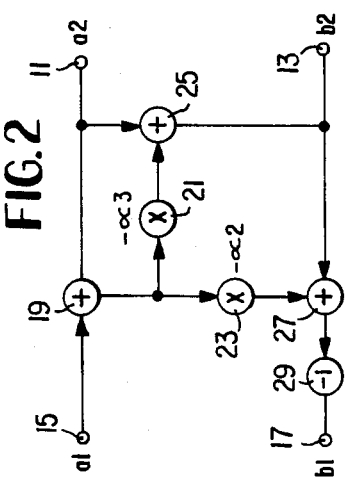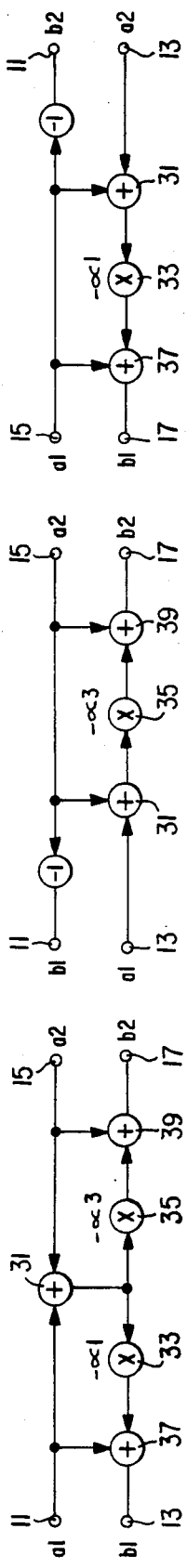

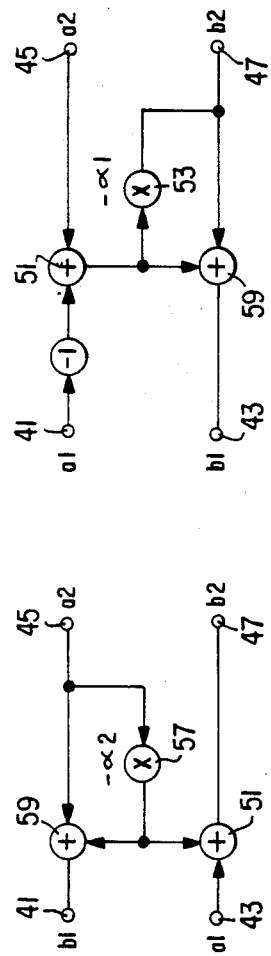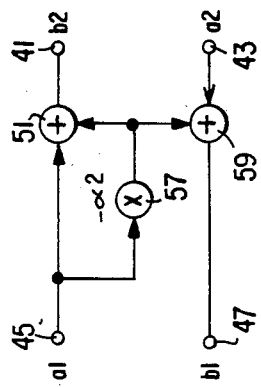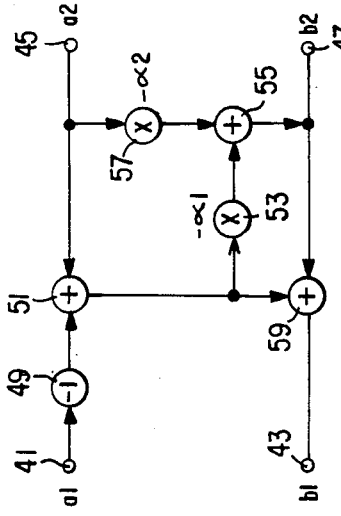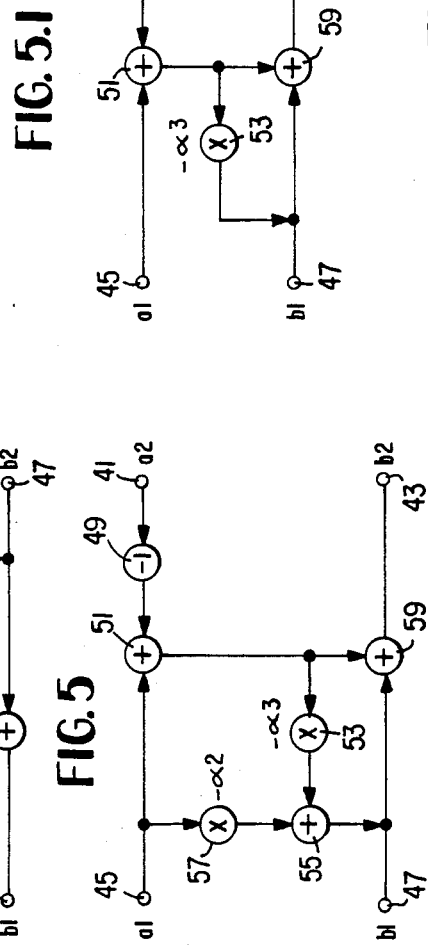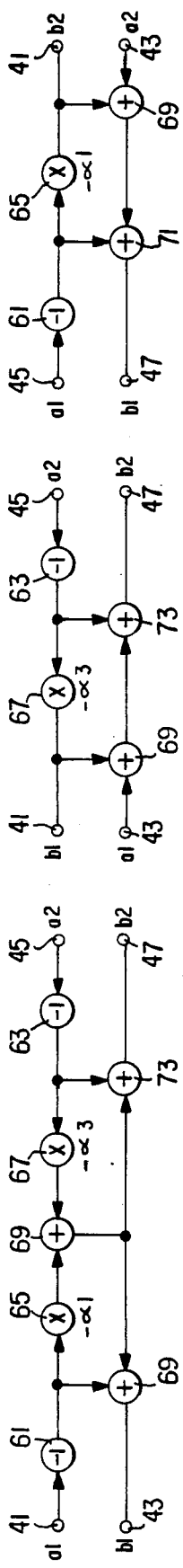

FIG. 7a
(PRIOR ART)
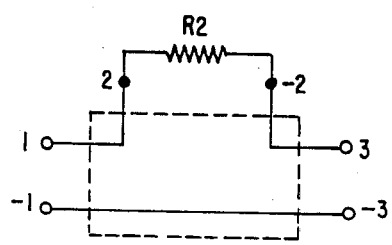
FIG. 7b
(PRIOR ART)
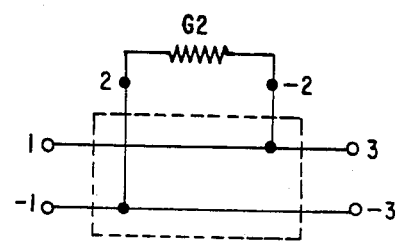
FIG. 7c
(PRIOR ART)
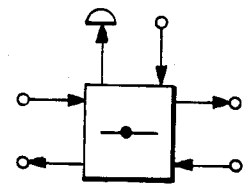
FIG. 7d
(PRIOR ART)
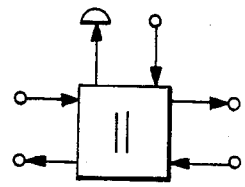
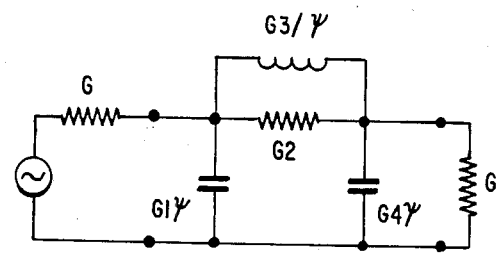
FIG. 8a
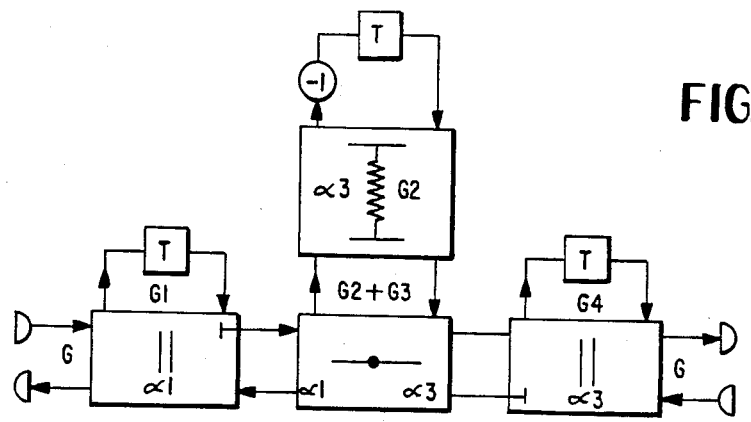
FIG. 8b

FIG. 9

| FIG. | SYMBOL | $\alpha$ | $\underset{\sim}{S}$ | $\underset{\sim}{T}$ |
|---|---|---|---|---|
| X | $a1 \to \boxed{R}\ b2$ ; $R1$ ... $R2$ ; $b1 \leftarrow \ \ \leftarrow a2$ | $\alpha 1, \alpha 2, \alpha 3$ | $\begin{pmatrix} b1 \\ b2 \end{pmatrix} = \underset{\sim}{S} \begin{pmatrix} a1 \\ a2 \end{pmatrix}$ | $\begin{pmatrix} b1 \\ a1 \end{pmatrix} = \underset{\sim}{T} \begin{pmatrix} a2 \\ b2 \end{pmatrix}$ |
| 1 | " | $\alpha 1 = \dfrac{2R1}{R1+R2+R}$  $\alpha 2 = \dfrac{R-(R1+R2)}{R1+R2+R}$ | $\begin{pmatrix} 1-\alpha 1 & -\alpha 1 \\ \alpha 2-(1-\alpha 1) & \alpha 1+\alpha 2 \end{pmatrix}$ | $\dfrac{1}{1+\alpha 1+\alpha 2}\begin{pmatrix} -\alpha 2 & 1-\alpha 1 \\ -\alpha 1-\alpha 2 & 1 \end{pmatrix}$ |
| 2 | " | $\alpha 2 = \dfrac{R-(R1+R2)}{R1+R2+R}$  $\alpha 3 = \dfrac{2R2}{R1+R2+R}$ | $\begin{pmatrix} \alpha 2+\alpha 3 & 1+\alpha 2+\alpha 3 \\ -\alpha 3 & 1-\alpha 3 \end{pmatrix}$ | $\dfrac{1}{\alpha 3}\begin{pmatrix} \alpha 2 & \alpha 2-\alpha 3 \\ 1-\alpha 3 & -1 \end{pmatrix}$ |
| 3 | " | $\alpha 1 = \dfrac{2R1}{R1+R2+R}$  $\alpha 3 = \dfrac{2R2}{R1+R2+R}$ | $\begin{pmatrix} 1-\alpha 1 & -\alpha 1 \\ -\alpha 3 & 1-\alpha 3 \end{pmatrix}$ | $\dfrac{1}{\alpha 3}\begin{pmatrix} 1-\alpha 1-\alpha 3 & -(1-\alpha 1) \\ 1-\alpha 3 & -1 \end{pmatrix}$ |
| 1.1 | R1=R2+R | $\alpha 2 = \dfrac{R}{R1} = \dfrac{R}{R2+R}$ | $\begin{pmatrix} 0 & -1 \\ \alpha 2-1 & \alpha 2 \end{pmatrix}$ | $\begin{pmatrix} -1 & 0 \\ \dfrac{\alpha 2}{1-\alpha 2} & \dfrac{1}{1-\alpha 2} \end{pmatrix}$ |
| 1.2 | R=R1+R2 | $\alpha 1 = \dfrac{R1}{R} = \dfrac{R1}{R1+R2}$ | $\begin{pmatrix} 1-\alpha 1 & -\alpha 1 \\ \alpha 1-1 & \alpha 1 \end{pmatrix}$ | $\begin{pmatrix} 0 & -1 \\ \dfrac{1}{1-\alpha 1} & \dfrac{1}{1-\alpha 1} \end{pmatrix}$ |
| 2.1 | R=R1+R2 | $\alpha 3 = \dfrac{R2}{R} = \dfrac{R2}{R1+R2}$ | $\begin{pmatrix} \alpha 3 & \alpha 3-1 \\ -\alpha 3 & 1-\alpha 3 \end{pmatrix}$ | $\begin{pmatrix} 0 & -1 \\ \dfrac{1-\alpha 3}{\alpha 3} & \dfrac{-1}{\alpha 3} \end{pmatrix}$ |
| 2.2 | R2=R1+R | $\alpha 2 = \dfrac{R}{R2} = \dfrac{R}{R1+R}$ | $\begin{pmatrix} \alpha 2 & \alpha 2-1 \\ -1 & 0 \end{pmatrix}$ | $\begin{pmatrix} \alpha 2-1 & -\alpha 2 \\ 0 & -1 \end{pmatrix}$ |
| 3.1 | R1=R2+R | $\alpha 3 = \dfrac{R2}{R1} = \dfrac{R2}{R2+R}$ | $\begin{pmatrix} 0 & -1 \\ -\alpha 3 & 1-\alpha 3 \end{pmatrix}$ | $\begin{pmatrix} -1 & 0 \\ \dfrac{1-\alpha 3}{\alpha 3} & \dfrac{-1}{\alpha 3} \end{pmatrix}$ |
| 3.2 | R2=R1+R | $\alpha 1 = \dfrac{R1}{R2} = \dfrac{R1}{R+R1}$ | $\begin{pmatrix} 1-\alpha 1 & -\alpha 1 \\ -1 & 0 \end{pmatrix}$ | $\begin{pmatrix} -\alpha 1 & \alpha 1-1 \\ 0 & -1 \end{pmatrix}$ |

FIG. 10

| FIG. | SYMBOL | $\alpha$ | $\underset{\sim}{S}$ | $\underset{\sim}{T}$ |
|---|---|---|---|---|
| X | a1─□─b2<br>G1   G2<br>b1─□─a2 | $\alpha_1, \alpha_2, \alpha_3$ | $\begin{pmatrix} b_1 \\ b_2 \end{pmatrix} = \underset{\sim}{S} \begin{pmatrix} a_1 \\ a_2 \end{pmatrix}$ | $\begin{pmatrix} b_1 \\ a_1 \end{pmatrix} = \underset{\sim}{T} \begin{pmatrix} a_2 \\ b_2 \end{pmatrix}$ |
| 4 | " | $\alpha_1 = \dfrac{2G_1}{G_1+G_2+G}$<br>$\alpha_2 = \dfrac{G-(G_1+G_2)}{G_1+G_2+G}$ | $\begin{pmatrix} \alpha_1-1 & 1-\alpha_1-\alpha_2 \\ \alpha_1 & -\alpha_1-\alpha_2 \end{pmatrix}$ | $\dfrac{1}{\alpha_1}\begin{pmatrix} -\alpha_2 & \alpha_1-1 \\ \alpha_1+\alpha_2 & 1 \end{pmatrix}$ |
| 5 | " | $\alpha_2 = \dfrac{G-(G_1+G_2)}{G_1+G_2+G}$<br>$\alpha_3 = \dfrac{2G_2}{G_1+G_2+G}$ | $\begin{pmatrix} \alpha_2-\alpha_3 & \alpha_3 \\ 1+\alpha_2-\alpha_3 & \alpha_3-1 \end{pmatrix}$ | $\dfrac{1}{1+\alpha_2+\alpha_3}\begin{pmatrix} \alpha_2 & \alpha_2-\alpha_3 \\ 1-\alpha_3 & 1 \end{pmatrix}$ |
| 6 | " | $\alpha_1 = \dfrac{2G_1}{G_1+G_2+G}$<br>$\alpha_3 = \dfrac{2G_2}{G_1+G_2+G}$ | $\begin{pmatrix} \alpha_1-1 & \alpha_3 \\ \alpha_1 & \alpha_3-1 \end{pmatrix}$ | $\dfrac{1}{\alpha_1}\begin{pmatrix} \alpha_1+\alpha_3-1 & \alpha_1-1 \\ 1-\alpha_3 & 1 \end{pmatrix}$ |
| 4.1 | $G_1 = G_2+G$<br>[box symbol]  " | $\alpha_2 = \dfrac{G}{G_1} = \dfrac{G}{G_2+G}$ | $\begin{pmatrix} 0 & \alpha_1-\alpha_2 \\ 1 & -\alpha_2 \end{pmatrix}$ | $\begin{pmatrix} 1-\alpha_2 & 0 \\ \alpha_2 & 1 \end{pmatrix}$ |
| 4.2 | $G = G_1+G_2$<br>  " | $\alpha_1 = \dfrac{G_1}{G} = \dfrac{G_1}{G_1+G_2}$ | $\begin{pmatrix} \alpha_1-1 & \alpha_1-\alpha_1 \\ \alpha_1 & -\alpha_1 \end{pmatrix}$ | $\begin{pmatrix} 0 & -\dfrac{1-\alpha_1}{\alpha_1} \\ 1 & \dfrac{1}{\alpha_1} \end{pmatrix}$ |
| 5.1 | $G = G_1+G_2$<br>  " | $\alpha_3 = \dfrac{G_2}{G} = \dfrac{G_2}{G_1+G_2}$ | $\begin{pmatrix} -\alpha_3 & \alpha_3 \\ 1-\alpha_3 & \alpha_3-1 \end{pmatrix}$ | $\begin{pmatrix} 0 & -\dfrac{\alpha_3}{1-\alpha_3} \\ 1 & \dfrac{1}{1-\alpha_3} \end{pmatrix}$ |
| 5.2 | $G_2 = G_1+G$<br>[box symbol]  " | $\alpha_2 = \dfrac{G}{G_2} = \dfrac{G}{G_1+G}$ | $\begin{pmatrix} -\alpha_2 & 1 \\ 1-\alpha_2 & 0 \end{pmatrix}$ | $\begin{pmatrix} 1 & -\dfrac{\alpha_2}{1-\alpha_2} \\ 0 & \dfrac{1}{1-\alpha_2} \end{pmatrix}$ |
| 6.1 | $G_1 = G_2+G$<br>[box symbol]  " | $\alpha_3 = \dfrac{G_2}{G_1} = \dfrac{G_2}{G_2+G}$ | $\begin{pmatrix} 0 & \alpha_3 \\ 1 & \alpha_3-1 \end{pmatrix}$ | $\begin{pmatrix} \alpha_3 & 0 \\ 1-\alpha_3 & 1 \end{pmatrix}$ |
| 6.2 | $G_2 = G_1+G$<br>[box symbol]  " | $\alpha_1 = \dfrac{G_1}{G_2} = \dfrac{G_1}{G_1+G}$ | $\begin{pmatrix} \alpha_1-1 & 1 \\ \alpha_1 & 0 \end{pmatrix}$ | $\begin{pmatrix} 1 & -\dfrac{1-\alpha_1}{\alpha_1} \\ 0 & \dfrac{1}{\alpha_1} \end{pmatrix}$ |

CIRCUIT ARRANGEMENT FOR SIMULATING A RESISTIVE ELEMENTARY TWO PORT DEVICE FOR USE IN A WAVE DIGITAL FILTER

BACKGROUND OF THE INVENTION

The present invention relates to a circuit arrangement for simulating a resistive elementary two port device for use in a wave digital filter.

Wave digital filters are disclosed, for example, in German Offenlegungsschrift No. 2,027,303. The basic filter circuit is a conventional LC circuit for analog signals, preferably a branch circuit, wherein inductances and capacitances are designed a single-port delay-affected circuits; the line elements are designed as two-port delay-affected devices; idling, short-circuits, resistors, resistance-free sources and sources with resistance are designed as single-port circuits without delay; and transformers, gyrators and circulators are designed as multiple-port circuits without delay. The single-port and multiple-port circuits are connected together correspondingly by means of adapters. Mutually resistive dual elementary two-port devices according to FIGS. 7a and 7b herein are realized as three-port series or parallel adapters, respectively, which are provided with a wave sink at the output of the corresponding port (see FIGS. 7c and 7d herein).

SUMMARY OF THE INVENTION

It is an object of the present invention to provide a circuit arrangement which makes it possible to build wave digital filters in a substantially less expensive manner, with their transmittance having zero positions which do not lie on the unit circle.

The above and other objects are accomplished by the present invention wherein a wave two port circuit arrangement is provided for simulating a resistive elementary two port device for use in a wave digital filter. The arrangement includes first and second ports each for receiving input and output signals. A first summing means is connected to the first and second ports and produces a sum signal which represents the sum of the input signals present at the first and second ports. A multiplier means is connected to the summing means and to one of the first and second ports for producing a negatively scaled sum signal and feeding it to the one port as part of the output signal present at that port.

Although FIG. 15 of the above-mentioned Offenlegungsschrift discloses a similar digital filter structure, that Figure represents a possible realization of a two-port adapter for the interconnection of two ports by means of port resistors R1 and R2, respectively, as shown in FIGS. 14a and 14b thereof, respectively.

The circuit arrangement according to the present invention requires substantially less summing members and multipliers. In optimum embodiments of the present invention only a single multiplier is required. Due to the finite signal word length, multipliers necessarily produce a disturbing noise in recursive filters, to which also belong wave digital filters. As a result the signal to noise ratio in a circuit arrangement according to the present invention also becomes significantly more favorable. The circuit arrngement according to the present invention makes it possible, in an advantageous manner, to realize attenuation equalizers.

Due to the finite signal word length, particularly in narrowband equalizers and filters, respectively, instabilities occur, such as limit cycle oscillations, which are understood to mean parasitic oscillations whose origin lies in a limited number of positions available in the filter for the numbers to be processed as electrical signal values (rounding up a multiplication result to the orginal number of digits). Such instabilities have a nonlinear effect. These limit cycles generally can not be completely eliminated in the realization of digital filters, particularly if higher-grade equalizers and filters are realized directly (see H. W. Schüssler, "Digitale Systeme zur Signalverarbeitung" [Digital Systems for Signal Processing], published by Springer Verlag, Berlin, Heidelberg and New York, 1973). The circuit arrangement according to the present invention, however, is able to assure complete stability if the measures proposed in German Auslegeschrift No. 2,418,923 are taken. However, in most cases, these stabilization measures will not be necessary at all because, due to the additional inclusion of resistive two-ports, the equalizers and filters according to the present invention exhibit a greatly pseudopassive behavior.

BRIEF DESCRIPTION OF THE DRAWINGS

FIGS. 1 to 6 are wave flow diagrams showing the digital realization of various resistive elementary two port devices according to the invention.

FIGS. 7a, 7b, 7c and 7d are diagrams of two mutually dually resistive elementary two port devices and their digital realization according to the prior art.

FIGS. 8a and 8b show an embodiment of a wave digital filter, with FIG. 8a depicting the analog reference filter and FIG. 8b the realization of the associated wave digital filter.

FIGS. 9 and 10 are tables of compilations of the possible digital realization of elementary dual resistance and conductance port devices according to the invention.

DESCRIPTION OF THE PREFERRED EMBODIMENTS

FIG. 1 shows a wave two port device including an input port represented by terminals 11 and 13 and an output port represented by terminals 15 and 17. Two input signals a1, a2 at input port terminal 11 and output port terminal 15, resectively, are combined in a first summing member 19 and are then negatively scaled by factors α1 and α2 by two multipliers 21 and 23, respectively. By means of a further summing member 25, the sum signal scaled by multiplier 21 is combined with the input signal a1 of input port terminal 11 and fed as output signal b1 to input port terminal 13 and also combined, by means of a third summing member 27 with the sum signal scaled by multiplier 23. The output of summing member 27 is inverted by an inverter 29 and fed to output port terminal 17 as output signal b2.

FIGS. 9 and 10 are compilations of the possible digital realization of elementary dual resistance and conductance port devices, with the left-hand column indicating the associated drawing figure number, the next following column indicating the symbol therefor, the next column the values for the multiplier coefficients and the last two columns indicating the scattering matrix $\underline{S}$ and transfer matrix $\underline{T}$, respectively.

The relations between input and output signals a1, a2 and b1, b2, respectively, are in the case of scattering matrix $$\underline{S} = \begin{pmatrix} S_{11} & S_{12} \\ S_{21} & S_{22} \end{pmatrix} ; \begin{pmatrix} b1 \\ b2 \end{pmatrix} = \underline{S} \begin{pmatrix} a1 \\ a2 \end{pmatrix},$$

which means $$b1 = S_{11} \cdot a1 + S_{12} \cdot a2$$

$$b2 = S_{21} \cdot a1 + S_{22} \cdot a2$$

and in the case of transfer matrix $$\underline{T} = \begin{pmatrix} T_{11} & T_{12} \\ T_{21} & T_{22} \end{pmatrix} \begin{pmatrix} b1 \\ a1 \end{pmatrix} = \underline{T} \begin{pmatrix} a2 \\ b2 \end{pmatrix},$$

which means $$b1 = T_{11} \cdot a2 + T_{12} \cdot b2$$

$$a1 = T_{21} \cdot a2 + T_{22} \cdot b2$$

Corresponding to the individual values of the scatter matrix $\underline{S}$ (shown in FIGS. 9 and 10), the dependencies of the two output signals on the input signals in FIG. 1 are as follows: $S_{11} = 1 - \alpha 1$, $S_{12} = -\alpha 1$, $S_{21} = \alpha 2 - (1 - \alpha 1)$, and $S_{22} = \alpha 1 + \alpha 2$. The other circuits in FIGS. 1.1 to 6 are constructed in a manner similar to FIG. 1.

FIG. 2 shows the same circuit as FIG. 1 except that the input and output ports are exchanged. In FIG. 3, the two input signals a1 and a2 are combined by means of a first summing member 31 and are then negatively scaled by means of two multipliers 33 and 35 having factors $-\alpha 1$ and $-\alpha 3$, respectively. The thus scaled sum signals are then combined, by means of further summing members 39 and 37, with the input signal a2 of output port terminal 15 and with the input signal a1 of input port terminal 11, respectively, and are fed as output signals b2 and b1, respectively, to output port terminal 17 and input port terminal 13, respectively.

The circuit arrangement according to FIG. 1.1 can be derived from the circuit arrangement according to 1 if the input port (terminals 11 and 13) is selected to be free of reflections, i.e. if $\alpha 1$ is selected to equal 1. FIG. 2.2 shows the same circuit arrangement of FIG. 1.1 but with the input and output ports interchanged. In a corresponding manner, the realization according to FIG. 1.2 can be derived from FIG. 1 is $a2$ is selected to equal 1. The same arrangement is shown in FIG. 2.1 with interchanged ports. FIG. 3.1 can be derived from FIG. 3 for $\alpha 1 = 1$ (with the input port being free of reflections), and FIG. 3.2 can be obtained with FIG. 3.1 with an interchange of ports.

FIGS. 4 through 6 show the digital realization of the dually resistive elementary two port devices with respect to FIGS. 1 through 3. In FIG. 4, the input signal a1 of the input port is inverted at inverter 49 and summed with the input signal a2 of the output port by means of a summing member 51. The output of member 51 is then scaled by $-\alpha 1$ by means of a multiplier 53 and added by means of a further summing member 55 to input signal a2 of output port terminal 45, which has been scaled by $-\alpha 2$ by means of a second multiplier 57 to form output signal b2 which appears at output port terminal 47. By means of a third summing member 59, output signal b2 is additionally combined with the sum of the inverted input signal a1 of input port terminal 41 and input signal a2 of output port terminal 45 to form output signal b1 at input port terminal 43.

The circuit of FIG. 5 is obtained from FIG. 4 by interchanging the input and output ports. In FIG. 6 the two input signals a1 and a2 are inverted by means of two inverters 61 and 63, are then negatively scaled by the factors $-\alpha 1$ and $-\alpha 3$ by means of two multipliers 65 and 67, respectively, the outputs of which are summed in adder 69. The sum signal of adder 69 is combined in adder 71 with the inverted input signal of input port terminal 41 to form output signal b1 at input port terminal 43 and in adder 73 with the inverted input signal a2 of output port terminal 45 to form output signal b2 at output port terminal 47. The circuit arrangement according to 4.1 is obtained from that of FIG. 4 if $\alpha 1 = 1$. The arrangement of FIG. 5.2 is again obtained from that of FIG. 4.1 by interchanging the ports. The arrangement of FIG. 4.2 is also obtained from that of FIG. 4 when $\alpha 2$ is selected to equal 1. The arrangement according to FIG. 5.1 is obtained by interchanging the ports of FIG. 4.2. The arrangement according to FIG. 6.1 is obtained from that according to FIG. 6 in that $\alpha 1$ is selected to equal 1. A mirror image to this is FIG. 6.2 (input and output ports are interchanged).

FIG. 8 shows an embodiment for a wave digital filter, with FIG. 8a showing the analog reference filter with the frequency variable $\Psi$ as defined in "Digital Filter Structures Related to Classical Filter Networks", Arch. Elek. Übertragung, Vol. 25, pp. 79–89, February 1971, and FIG. 8b the associated digital realization, cf. "On Adaptors for Wave Digital Filters", IEEE Trans. on Acoustics, Speech, and Signal Processing, Vol. ASSP-23, No. 6, December 1975, pp. 516–525.

A practical embodiment of the wave flow diagram according to FIG. 1 is given by the following computer program coded in FORTRAN (R1=1, R2=4, R=2 cf. FIG. 9)

```
SUBROUTINE FIG. 1 (A1, A2, B1, B2)
DATA ALFA1, ALFA2 /0.285714, −0.428571/
X1 = A1 + A2
X2 = −ALFA1*X1
B1 = A1 + X2
X3 = −ALFA2*X1
B2 = −(B1 + X3)
RETURN
END.
```

It will be understood that the above description of the present invention is susceptable to various modifications, changes and adaptations, and the same are intended to be comprehended within the meaning and range of equivalence of the appended claims.

What is claimed is:

1. A wave two port circuit arrangement for simulating a resistive elementary two port device for use in a wave digital filter, comprising:
   first and second ports each for receiving and transmitting input and output signals, respectively;
   first summing means connected to said first and second ports and producing a first sum signal which represents the sum of the input signals present at said first and second ports;
   first multiplier means connected to said first summing means for producing a first negatively scaled first sum signal and feeding it to one of said first and second ports as part of the output signal present at said one port;

second multiplier means connected to said first summing means for producing a second negatively scaled first sum signal and feeding to the other of said first and second ports as part of the output signal present at said other port;

second summing means connected to said one port and to said second multiplier means for producing a second sum signal which represents the sum of the output signal present at said one port and the second negatively scaled first sum signal; and an inverter connected to said second summing means and said other port for inverting the second sum signal and feeding it to said other port to form the output signal at that port.

2. A wave two port circuit arrangement for simulating a resistive elementary two port device for use in a wave digital filter, comprising:

first and second ports each for receiving and transmitting input and output signals, respectively;

first summing means connected to said first and second ports and producing a first sum signal which represents the sum of the input signals present at said first and second ports;

first multiplier means connected to said first summing means for producing a first negatively scaled first sum signal;

a second summing means connected to one of said first and second ports and to said first multiplier means for summing the input signal present at said one port with the scaled first sum signal to form the output signal of said one port;

a third summing means connected to said second summing means and to said second multiplier means for producing a further sum signal which represents the sum of the output signal of said one port and said second negatively scaled first sum signal; and an inverter connected to said third summing means and said other port for inverting the further sum signal to produce the output signal of said other port.

3. A wave two port circuit arrangement for simulating a resistive elementary two port device for use in a wave digital filter, comprising:

first and second ports each for receiving and transmitting input and output signals, respectively;

first summing means connected to said first and second ports and producing a first sum signal which represents the sum of the input signals present at said first and second ports;

first multiplier means connected to said first summing means for producing a first negatively scaled first sum signal;

a second summing means connected to one of said first and second ports and to said first multiplier means for summing the input signal present at said one port with the scaled first sum signal to form the output signal of said one port; and an inverter connected between said ports so that the input signal of said one port is inverted and the thus inverted input signal constitutes the output signal of the other of said ports.

4. A wave two port circuit arrangement for simulating a resistive elementary two port device for use in a wave digital filter, comprising:

first and second ports each for receiving and transmitting input and output signals, respectively;

first summing means connected to said first and second ports and producing a first sum signal which represents the sum of the input signals present at said first and second ports;

first multiplier means connected to said first summing means for producing a first negatively scaled first sum signal;

a second summing means connected to one of said first and second ports and to said first multiplier means for summing the input signal present at said one port with the scaled first sum signal to form the output signal of said one port; and an inverter connected between said ports for inverting the output signal of said one port and feeding such inverted output signal to the other of said ports as the output signal of said other port.

5. A wave two port circuit arrangement for simulating a resistive elementary two port device for use in a wave digital filter, comprising:

first and second ports each for receiving and transmitting input and outpt signals, respectively;

first summing means connected to said first and second ports and producing a first sum signal which represents the sum of the input signals present at said first and second ports;

first multiplier means connected to said first summing means for producing a first negatively scaled first sum signal and feeding it to one of said first and second ports as part of the output signal present at said one port;

a second summing means connected to said first multiplier means and the other of said ports for producing a second sum signal which represents the sum of the input signal present at said other port and the first negatively scaled first sum signal;

a first inverter connected to said second summing means for inverting the second sum signal and feeding it to said one port as its output signal; and a second inverter connected between said ports for inverting the input signal of said one port and feeding it to said other port as the output signal of that port.

6. A two wave port circuit arrangement for simulating a resistive elementary two port device for use in a wave digital filter, comprising:

first and second ports each for receiving and transmitting input and output signals, respectively;

first summing means connected to said first and second ports and producing a first sum signal which represents the sum of the input signals present at said first and second ports;

first multiplier means connected to said first summing means for producing a first negatively scaled first sum signal and feeding it to one of said first and second ports as part of the output signal present at said one port;

an inverter connected to said one port for inverting the input signal of said one port before that input signal is summed by said first summing means; and a second summing means connected to said first summing means, said first multiplier means and said one port for producing a second sum signal which represents the sum of said first sum signal and the first negatively scaled first sum signal and feeding the second sum signal to said one port as the output signal of that port.

7. Circuit arrangement as defined in claim 6, including a second multiplier means connected to the other of said first and second ports for negatively scaling the input signal of said other port and a third summing means connected to said first and second multiplier means and said other port for producing a third sum signal which represents the sum of said first negatively scaled first sum signal and the scaled input of said other port and feeding the third sum signal to said other port as the output signal of that port.

8. Circuit arrangement for simulating a resistive elementary two port device for use in a wave digital filter, comprising:
   first and second ports each for receiving and transmitting input and output signals, respectively;
   first multiplier means connected to said first port for negatively scaling the input signal present at said first port to produce a first scaled signal;
   first summing means connected to said second port and to said first multiplier means for producing a first sum signal representing the sum of the first scaled signal and the input signal obtained from said second port and feeding the first sum signal to one of said first and second ports as part of the output signal of that port; and
      a second multiplier means connected between said second port and said first summing means for negatively scaling the input signal at said second port to produce a second scaled signal which is fed to said first summing means and used to form the first sum signal.

9. Circuit arrangement as defined in claim 8, including first and second inverters each having an input connected to a respective one of said first and second ports and an output connected to a respective one of said first and second multiplier means, said inverters inverting the respective input signals before they are negatively scaled, and two further summing means each being connected with said first summing means, a respective one of said inverters and a respective one of said ports for summing the first sum signal and the respective inverted input signal to form another sum signal which is fed to the respective port as the output signal of that port.

10. Circuit arrangement for simulating a resistive elementary two port device for use in a wave digital filter, comprising:
   first and second ports each for receiving and transmitting input and output signals, respectively;
   first multiplier means connected to said first port for negtively scaling the input signal present at said first port to produce a first scaled signal;
   first summing means connected to said second port and to said first multiplier means for producing a first sum signal representing the sum of the first scaled signal and the input signal present at said second port and feeding the first sum signal to one of said first and second ports as part of the output signal of that port; and
   a second summing means having one input connected directly to said first port and another input connected to said first multiplier means for producing a second sum signal which represents the sum of the unscaled input signal of said first port and the first scaled signal, and for feeding the second sum signal to the other of said first and second ports as the output signal for that port.

11. Circuit arrangement for simulating a resistive elementary two port device for use in a wave digital filter, comprising: simulating a resistive elementary two port device for use in a wave digital filter, comprising:
   first and second ports each for receiving and transmitting input and output signals, respectively;
   first multiplier means connected between said first and second ports for negatively scaling the input signal present at said first port to produce a first scaled signal;
   first summing means connected to said second port and to said first multiplier means for producing a first sum signal representing the sum of the first scaled signal and the input signal present at said second port and feeding the first sum signal to one of said first and second ports as part of the output signal of that port;
   an inverter connected between said first multiplier means and said first port for inverting the input signal of the said first port before it is scaled, with the inverted negatively scaled input signal of said first port being fed to said second port as the output signal of that port; and
   a second summing means connected to said inverter, said first summing means and said first port for producing a second sum signal which represents the sum of the inverted input signal of said first port and said first sum signal and feeding said second sum signal to said first port as the output signal of that port.

* * * * *